Aug. 24, 1965 C. W. MATSON ETAL 3,202,869

ELECTRICAL APPARATUS WITH INSULATED HEAT CONDUCTING MEMBERS

Filed Dec. 10, 1962 2 Sheets-Sheet 1

INVENTORS
CHARLES W. MATSON
LEROY A. PROHOFSKY
BY Thomas J. Nikolai
ATTORNEY

Aug. 24, 1965 C. W. MATSON ETAL 3,202,869

ELECTRICAL APPARATUS WITH INSULATED HEAT CONDUCTING MEMBERS

Filed Dec. 10, 1962 2 Sheets-Sheet 2

INVENTORS
CHARLES W. MATSON
LEROY A. PROHOFSKY
BY Thomas J. Nikolai
ATTORNEY 3,202,869

ELECTRICAL APPARATUS WITH INSULATED HEAT CONDUCTING MEMBERS

Charles W. Matson, St. Paul, and Le Roy A. Prohofsky, Minneapolis, Minn., assignors to Sperry Rand Corporation, New York, N.Y., a corporation of Delaware Filed Dec. 10, 1962, Ser. No. 243,532
13 Claims. (Cl. 317—100)

This invention relates generally to microminiature electronic packaging techniques, and more specifically to an improved packaging arrangement of electronic components wherein internally generated heat energy is conducted out of the package.

In the recent past, steps have been taken to reduce the physical size of electronic devices. For example, the transistor has to a great extent, supplanted the vacuum tube as the active element in many electronic circuits. More recently, however, engineers and scientists have been investigating the use of so called integrated or microtronic circuits wherein semiconductor networks, resistors, diodes, capacitors and their associated conductive interconnections are all contained on a single semiconductor wafer. In order to add mechanical stability to these microtronic circuits, it has been found to be expedient to encapsulate the wafer in a suitable potting compound with only the leads used for external connections extending therefrom. As such, the power dissipating elements in the microtronic circuits cannot get rid of the heat by a normal thermal convection process.

In order to implement an electronic system or subsystem from these microtronic circuits, means are required for inter-connecting a plurality of these integrated circuits. Of course, to gain the benefit of the small size of the microtronic circuit itself, it is necessary that the interconnecting means be designed to achieve extremely close spacing between interconnected circuits. With a higher and higher packing density of microtronic circuit comes the attendant problem of temperature control, since component values are temperature sensitive, at least to some extent. In other words, as the circuit elements themselves are physically located closer and closer together the problem of removing internally generated heat from the subsystem becomes quite acute. This is especially true where the electronic system is to be used in missile or space applications. When the system is designed to operate in a high altitude environment where the atmosphere is very thin or even non-existent, one cannot rely on thermal convection to carry away the heat generated within the microtronic circuit element. Instead, it is necessary that the heat be dissipated by a process of thermal conduction.

It is accordingly an object of the present invention to provide new and improved apparatus for interconnecting a plurality of microtronic circuit elements.

It is another object of this invention to provide novel interconnecting or packaging apparatus wherein a great number of electronic circuits may be contained in an extremely small volume.

It is a further object of this invention to provide packaging apparatus for microtronic circuits wherein heat generated within the circuit components themselves may be dissipated by a process of thermal conduction.

The above-mentioned and other features and objects of this invention will become more apparent by reference to the following description taken in conjunction with the accompanying drawings, in which.

Figure 1:
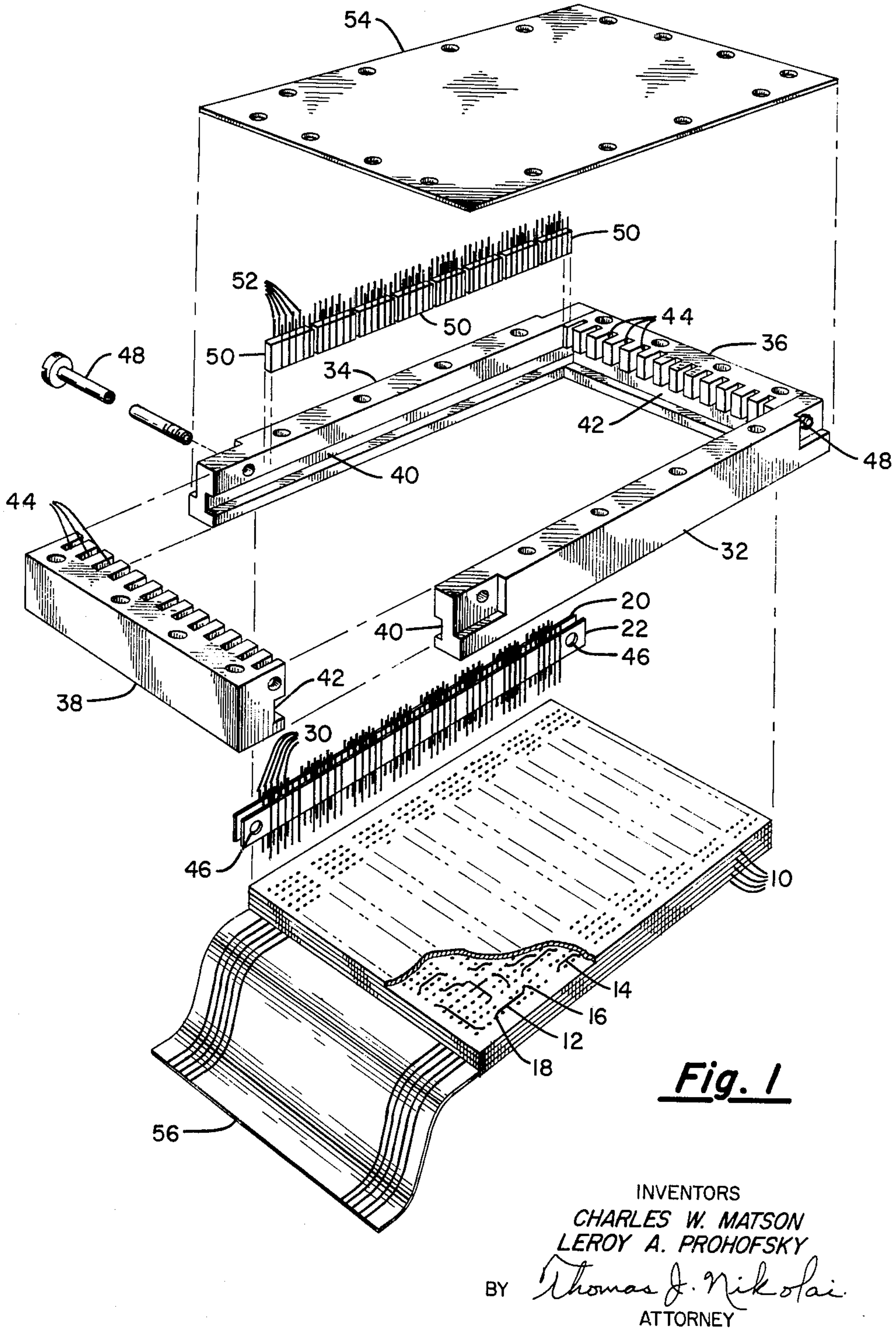
FIG. 1 is an exploded and somewhat enlarged pictorial view of the circuit package of this invention.

Referring now to FIG. 1, there is shown a plurality of printed circuit boards 10, stacked one above the other. Each of the boards in the stack is comprised of an insulating substrates on which is affixed a pattern of conductive strips, for example, strips 12 and 14, arranged in a predetermined pattern on each board. Also, each board has a plurality of apertures or holes drilled or punched therethrough. The hole pattern on each layer of the stack is identical so that when the layers are placed in a stacked relationship, the holes form a continuous cylindrical channel from the top of the stack to the bottom. To give an idea of the close spacing involved, but with no limitation intended, the distance between centers of the holes in adjacent rows of one column may be 0.035 inch and the spacing between holes in two adjacent columns may be 0.050 inch.

During fabrication of the printed circuit boards 10, the apertures therein have a conductive coating affixed to the walls thereof. In other words, the printed circuit boards are provided with "plated-through holes." When it is desired to connect two points such as points 16 and 18, on the printed circuit boards together, a conductive strip such as strip 12 is provided which electrically connects the conductive surface on the wall of hole 16 to the conductive coating on the wall of hole 18. The process employed to create the conductive strips 12 and 14 and the plated-through holes on the board is not felt to be of importance in understanding the construction and workings of a packaging apparatus of this invention.

Also included in the packaging assembly of this invention are a plurality of heat conducting strips, only two of which are shown and identified as strips 20 and 22. These strips are provided with an electrically insulating surface, and in the preferred embodiment of the present invention are formed from strips of aluminum which have an aluminum oxide coating on the surface thereof. However, it should be understood that other materials are available from which the heat sink strips may be fabricated and it is not intended to limit the invention to the aluminum-aluminum oxide combination.

Figure 2:
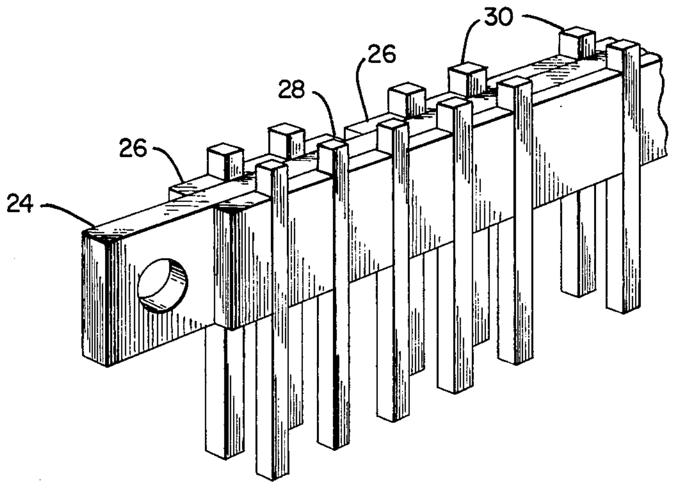
FIG. 2 illustrates an enlarged view of a heat sink strip of the type employed in the package of FIG. 1.

An exemplarly heat sink strip 24 is shown in greatly enlarged form in FIG. 2. The heat sink strip 24 has a plurality of dividers 26 affixed thereto so as to define channels 28 between two adjacent dividers. Alternatively, the channels could be formed by cutting transverse notches in the heat sink strip itself, rather than by affixing separate dividers thereto. The spacing between adjacent dividers preferably corresponds to the center-to-center spacing between the apertures in two adjacent rows of column of apertures on the printed circuit board 10. Thus, the distance between centers of the channels defined by the dividers 26 may be 0.035 inch corresponding to the already mentioned aperture-to-aperture spacing on the printed circuit board.

During the assembly of the microtronic circuit packaging apparatus of this invention, a plurality of conductive pins 30, are inserted in the channels defined by the dividers 26 and are held in place by a suitable bonding agent. The heat sink strips 24 are therefore in thermal contact with the pin members 30, but the pins 30 are electrically insulated from one another because of the oxide coating on the surface of the strip 24. It should be noted here that the conductive pins are bonded to both sides of the strip 24 and that the thickness of strip 24 is such that the center-to-center spacing between pins on either side of the strip corresponds to the center-to-center spacing between apertures in adjacent columns on the printed circuit boards 10.

A substantial portion of the pin member 30 extends from the bottom edge of the heat sink strip 24. Also, for reasons which will be explained hereinbelow the pin members extend slightly from the top edge of the heat sink strip as illustrated in FIGURE 2. The bottom extensions are designed to fit into the apertures in the stack of printed circuit boards and to extend through the entire stack. In other words, the heat sink strips 20 and 22 of FIGURE 1 with their conductive pins 30 attached thereto are adapted to be plugged into the stack of printed circuit boards. When in place, the conductive pins engage the conductive coatings on the walls of the apertures in the printed circuit cards and electrically connect the apertures on one board to the corresponding aperture on the other boards in the stack. By extending the conductive pins out from the bottom board in the stack slightly they become available as test points to which various testing devices may be connected during check-out and maintenance periods.

While for most applications it may be sufficient to merely plug the heat sink strips 20 and 22 into the printed circuit stack, for some applications where a high degree of reliability is necessary, it may be desirable to permanently solder the pins connected to the heat sink strips to the conductive coating on the apertures of the printed circuit stack. This may be accomplished by tinning the portion of the pins which extend from the bottom edge of the heat sink strip with solder, and also tinning the conductive coating on the wall of the apertures. Subsequently, then, the pins may be plugged into the printed circuit stack and the entire assembly subjected to a sufficiently high temperature thereto to cause the solder to melt and flow. When the assembly is subsequently allowed to cool, the heat sink strips are permanently soldered to the printed circuit stack.

After all of the heat sink strips 20 and 22 have been plugged onto the printed circuit stack, the assembly may be placed in a frame which, in addition to adding rigidity to the assembly, provides a thermally conductive path from the heat sink strips to the outside environment. As is shown in FIG. 1, the frame is comprised of a pair of side edge members 32 and 34 and a pair of end edge members 36 and 38. The side edge members each have a channel 40 cut longitudinally therein of a sufficient width to just accommodate the thickness of the printed circuit stack. In other words, the printed circuit stack is designed to fit tightly into the channels formed in the side members 32 and 34.

In a similar manner, the end edge members 36 and 38 also have a longitudinal channel 42 cut therein, the dimension of the channel being such as to accommodate the end edge of the stack of printed circuit cards. In addition to the longitudinal channel 42, the end edge members 36 and 38 are provided with a plurality of slots 44 which are cut in a direction transverse to the channels 42. The slots 44 have a width sufficient to accommodate the end of the heat sink strips 20 and 22. Therefore, when the end edge members 36 and 38 are placed in an operative relationship with the heat sink strips, the heat sink strips are maintained in a parallel and spaced-apart relationship with one another. As can be seen in FIG. 1, at each end of the heat sink strips 20 and 22 is a hole 46. The side edge members 32 and 34 and the end edge members 36 and 38, with the printed circuit stack and heat sink strips clamped therein, are held in place by means of a pair of bolts 48 which pass through the holes 46 in the heat sink strips which are aligned with a hole cut longitudinally through the end edge members 36 and 38.

Figure 3:
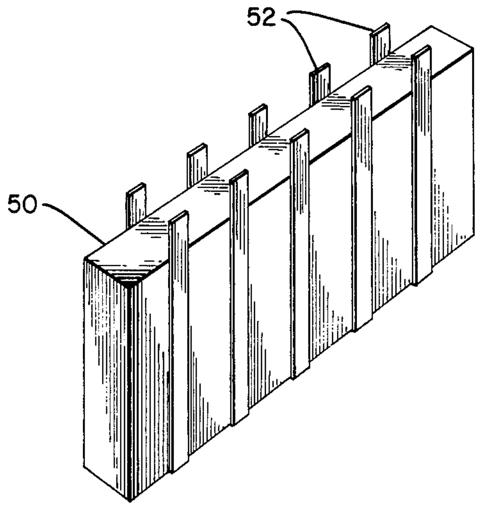
FIG. 3 illustrates a greatly enlarged view of a typical microtronic circuit element.

After the printed circuit stack with the heat sink strips in place are clamped in the frame, the microtronic circuits 50 may be inserted into the assembly. As is shown in FIG. 3, the microtronic circuit is preferably a relatively flat, hermetically sealed unit, which in the preferred embodiment of the present invention measures only 0.250 x 0.0125 x 0.035 inch. It is illustrated as having five ribbon type leads 52 on each side. These leads are parallel to one another and are spaced apart by a distance corresponding to the distance between adjacent pins on the heat sink strips. These leads extend from the top edge of the encapsulated unit to a slight degree, corresponding to the extension of the pin members 30 beyond the top edge of the heat sink strip 24 of FIGURE 2. As mentioned in the introductory portion of this specification, each of the elements 50 may contain a plurality of electrical components such as resistors, capacitors, semiconductor devices, etc., integrated into a semiconductor wafer.

The spacing between two adjacent heat sink strips is such that the circuits 50 can be made to fit therebetween with their leads 52 pointing upward, i.e., away from the stack of printed circuit cards. In the preferred embodiment of the present invention, it is possible to locate eight microtronic circuit elements in a row between two adjacent heat sink strips. Also, in this preferred embodiment there are 25 heat sink strips which form 24 rows with eight microtronic circuit elements in each row. The apparatus of this invention therefore provides a means for electrically interconnecting 192 microtronic circuits. The complete module with all 192 circuits in place measures only 3.063 x 2.563 x 0.500 inch.

Because the spacing between leads on the microtronic circuit elements 50 and the spacing between pins on the heat sink strips 20 and 22 each correspond to the aperture-to-aperture spacing on the printed circuit stack, when the circuit elements 50 are inserted between the heat strips, the leads thereon line up with the pins to thereby facilitate an electrical connection from the leads to the pins. The method employed to attach the circuit leads to the portion of the conductive pins which extend above the heat sink strips is not felt to be important to the understanding of the present invention, but in one arrangement these leads are soldered to the pins to insure a more reliable connection. Considering the dimensions already given, it can be seen then that in an area of only 7.85 square inches it is possible to make 1,920 separate electrical connections. The finished module containing the 192 microtronic circuit elements, the heat shield strips, the frame, the printed circuit stack occupies only 3.92 cubic inches.

Depending upon the particular environment where the packing apparatus of this invention is employed, it may be desirable to provide a cover plate such as plate 54 in FIG. 1. The plate is adapted to be connected to the frame member by screws or other suitable connecting means and when in place serves to protect the apparatus from dust and other foreign matter. Additionally, the plate 54 is preferably formed from a heat conductive material, and because of its area provides a surface from which heat may be radiated.

In order to electrically connect one circuit package of the type shown in FIG. 1 to another, it has been found to be convenient to employ flexible printed circuit conductors 56, various forms of which are well known in the prior art. Certain terminals within the stack of printed circuit boards may be connected by printed wiring and by the pin members to a row or group of rows on one edge of one board in the stack. The flexible wiring 56 may then be connected to this row of terminals and to a similar row of terminals on another module.

To electrically connect a lead of one microtronic element to a particular lead on another of said elements, the circuit path followed is from the first lead, through the pin to which it is connected, to the conductive coating on the wall of one of the apertures in the stack through which the pin in question passes, and from there via the conductive strip on one of the printed circuit boards in the stack, to the conductive coating on another aperture, through the pin in that aperture to the lead on the other one of said microtronic elements. On the other hand, the path for heat flow from a power dissipating component in the microtronic element from the element directly to the heat sink strips as well as is through the electrical leads of this element to the pins to which the leads are connected, through the pins to the heat sink strips, through the heat sink strips to the edge members 36 and 38, through the edge members 36 and 38 of the frame, and from there to the side edge member 32 and 34 and to the cover plate 54 to the outside environment.

While we have described above the principles of my invention in connection with the specific apparatus, it is to be clearly understood that this description is made only by way of examples and not a limitation to the scope of my invention as set forth in the objects thereof and in the following claims.

We claim:

1. Electrical apparatus comprising:

A. A plurality of layers of insulating substrates each substrate having,
  (a) a pattern of conductive strips thereon,
  (b) a plurality of apertures therethrough arranged in accordance with a predetermined pattern,
  (c) a conductive coating on the wall of predetermined ones of the apertures,
  (d) the conductive strips terminating at predetermined ones of said apertures and electrically connected to the conductive coating on the walls of said ones of said apertures;

B. A plurality of electrically insulating, heat conducting members;

C. A plurality of conductive pins affixed to said electrically insulating heat conducting members and extending from at least one edge thereof such that said pins are
  (a) spaced apart from one another in accordance with said predetermined pattern of apertures,
  (b) adapted to engage the conducting coating on the walls of the apertures when inserted into said apertures;

D. A plurality of encapsulated electrical circuits having,
  (a) electrically conducting, heat conducting leads extending from one edge thereof, said leads being, spaced apart from one another in accordance with said predetermined pattern of apertures;

E. And means for connecting said leads to said pins to form an electrically interconnected package of circuits wherein thermal energy is dissipated from said encapsulated electrical circuits.

2. Apparatus as in claim 1 and further including a supporting frame comprising:

A. A pair of end members each having,
  (a) transversely disposed slots cut therein adapted to accommodate said heat conducting members in a parallel and spaced apart relation, and
  (b) longitudinally disposed slots cut therein adapted to accommodate opposite end edges of said layers of insulating substrates, B. A pair of side members having longitudinally disposed slots cut therein adapted to accommodate opposite side edges of said layers of insulating substrates; and C. Means for connecting said side members to said end members to thereby securely clamp said substrates and said heat conducting members together.

3. Apparatus as in claim 2 wherein said vertically disposed slots cut in said end members are spaced apart from one another by a distance substantially equal to one dimension of said encapsulated electrical circuits.

4. Apparatus as in claim 2 wherein said end members and said side members are made of a thermally conductive material.

5. Apparatus as in claim 4 wherein the means connecting said leads to said pins is solder.

6. Apparatus as in claim 1 wherein said heat conducting members are comprised of rectangular metallic strips having an electrically insulating surface and having a plurality of divider segments affixed thereto to define a plurality of parallel slots on either side of said strips.

7. Apparatus as in claim 6 wherein said slots are spaced apart from one another in accordance with said predetermined pattern of apertures and adapted to accommodate said conductive pins to maintain them in said parallel and spaced apart relation.

8. Apparatus as in claim 1 wherein said heat conducting members are comprised of rectangular metallic strips having an electrically insulating surface and having a plurality of notches cut therein to define a plurality of parallel slots on either side of said strips.

9. Apparatus as in claim 1 wherein said conductive pins are at least of sufficient length to engage the apertures on said plurality of layers of insulating substrates when said substrates are placed in a stacked relationship with one another.

10. Electrical apparatus comprising:

A. A plurality of insulating substrates each having,
  (a) a predetermined pattern of conductive strips thereon,
  (b) a plurality of parallel rows of apertures therethrough arranged at predetermined coordinate locations such that when said substrates are superimposed in a stacked relationship the apertures on the substrates are aligned,
  (c) a conductive coating on the wall of each of the apertures,
  (d) said conductive strips terminating at predetermined ones of said apertures and electrically connected to said conductive coating of said predetermined ones of said apertures;

B. A plurality of thermally conducting strips having electrically insulating surfaces;

C. A plurality of thermally and electrically conductive pins affixed to said thermally conducting strips and extending from one edge thereof such that said pins are
  (a) parallel to one another,
  (b) spaced apart from one another in accordance with the coordinate location of the aperture in said substrates and,
  (c) adapted to make electrical contact with the conducting coating on the walls of the apertures when inserted into said apertures;

D. A plurality of encapsulated electrical circuits of rectangular shape having,
  (a) electrically conducting, heat conducting leads extending from one edge thereof, said leads being,
    (1) parallel to one another and,
    (2) spaced apart from one another in accordance with the coordinate location of the apertures in said substrate;

E. And means connecting said leads to said pins to form an electrically interconnected package of circuits wherein thermal energy is dissipated from said encapsulated electrical circuits.

11. Apparatus as in claim 10 wherein said conductive coating on the walls of the apertures is a solderable material.

12. Apparatus for interconnecting a plurality of individual circuit elements into a module comprising:

A. A plurality of printed circuit boards having a predetermined pattern of plated-through holes therein and a predetermined pattern of conductive strips thereon, B. A plurality of thermally conductive strips, C. A plurality of electrically and thermally conductive pins affixed to said thermally conductive strips and extending from at least one edge thereof in a parallel and spaced-apart relation in accordance with said predetermined pattern of plated-through holes;

D. A frame including a pair of end members having a plurality of transverse slots therein for receiving the ends of said strips and longitudinal grooves therein for receiving the end edges of said plurality of printed circuit boards when stacked one above the other with said pins extending through said holes, and a pair of side members having a longitudinal groove therein for receiving the side edges of said plurality of printed circuit boards when stacked one above the other, E. Means for connecting said side members to said end members, F. A plurality of individually encapsulated circuit elements having a plurality of leads extending from one edge thereof and spaced apart from one another in accordance with the spacing between adjacent ones of said pins adapted to be inserted between adjacent ones of said conductive strips;

G. Means connecting said leads to predetermined ones of said pins such that the thermal energy developed within said encapsulated circuit elements may pass by way of said leads, said pins and said thermally conductive strips to said frame member and such that predetermined leads of said elements are electrically connected by way of said pins and said predetermined pattern of conductive strips, and H. At least one cover plate adapted to be connected to said frame member for shielding the module from foreign matter.

13. Electrical apparatus comprising:

A. A plurality of layers of insulating substrates each substrate having, (a) a pattern of conductive strips thereon, (b) a plurality of apertures therethrough arranged in accordance with a predetermined pattern, (c) a conductive coating on the wall of predetermined ones of the apertures, (d) the conductive strips terminating at predetermined ones of said apertures and electrically connected to the conductive coating on the walls of said ones of said apertures;

B. A plurality of electrically insulating, heat conducting members;

C. A plurality of conductive pins affixed to said electrically insulating heat conducting members and extending from at least one edge thereof such that said pins are (a) spaced apart from one another in accordance with said predetermined pattern of apertures, (b) adapted to engage the conducting coating on the walls of the apertures when inserted into said apertures;

D. A plurality of encapsulated electrical circuits having, (a) electrically conducting, heat conducting leads extending from one edge thereof, said leads being, spaced apart from one another in accordance with said predetermined pattern of apertures.

E. And means for connecting said leads to said pins to form an electrically interconnected package of circuits wherein thermal energy is dissipated from said encapsulated electrical circuits by way of conduction through said leads, pins, and heat conductive members, said thermal energy also being dissipated by conduction from said encapsulated circuits directly to the heat conducting members.

No references cited.

KATHLEEN H. CLAFFY, *Primary Examiner.*

JOHN F. BURNS, *Examiner.*